(12) United States Patent
Hsu et al.

(10) Patent No.: US 11,387,806 B2
(45) Date of Patent: Jul. 12, 2022

(54) SURFACE ACOUSTIC WAVE FILTER PACKAGE STRUCTURE AND METHOD OF MANUFACTURING THE SAME

(71) Applicant: Phoenix Pioneer Technology Co., Ltd., Hsinchu County (TW)

(72) Inventors: Shih-Ping Hsu, Hsinchu County (TW); Che-Wei Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 68 days.

(21) Appl. No.: 16/676,569

(22) Filed: Nov. 7, 2019

(65) Prior Publication Data

US 2020/0153409 A1 May 14, 2020

(30) Foreign Application Priority Data

Nov. 9, 2018 (TW) ................. 107139798

(51) Int. Cl.
*H03H 9/10* (2006.01)
*H03H 9/02* (2006.01)
(Continued)

(52) U.S. Cl.
CPC ........... *H03H 9/1092* (2013.01); *H01L 23/31* (2013.01); *H01L 23/488* (2013.01);
(Continued)

(58) Field of Classification Search
CPC ...... H03H 9/64; H03H 9/02992; H03H 9/059; H03H 9/1092; H03H 9/14541; H03H 9/25; H03H 3/10; H03H 9/02834; H03H 9/1071; H01L 23/31; H01L 23/488; H01L 21/561; H01L 24/11; H01L 2224/11312; H01L 2224/1132; H01L 24/27; H01L 24/13; H01L 24/81; H01L 24/83; H01L 2221/68345; H01L 2224/131; H01L 2224/13116; H01L 2224/2919; H01L 21/568; H01L 21/6835; H01L 24/29;
(Continued)

(56) References Cited

U.S. PATENT DOCUMENTS

2017/0331455 A1* 11/2017 Kuroyanagi ............. H03H 3/02

* cited by examiner

*Primary Examiner* — Rakesh B Patel
*Assistant Examiner* — Jorge L Salazar, Jr.
(74) *Attorney, Agent, or Firm* — McClure, Qualey & Rodack, LLP

(57) ABSTRACT

A surface acoustic wave (SAW) filter package structure includes a dielectric substrate having a dielectric layer, a first patterned conductive layer, a second patterned conductive layer, and a conductive connection layer. The conductive connection layer is electrically connected between the first patterned conductive layer and the second patterned conductive layer, which are disposed at opposite sides of the dielectric layer. The second patterned conductive layer has a finger electrode portion. An active surface of a chip is faced toward the finger electrode portion. A polymer sealing frame is disposed between the chip and the dielectric substrate and surrounds the periphery of the chip to form a chamber together with the chip and the dielectric substrate. The mold sealing layer is disposed on the dielectric substrate and covers the chip and the polymer sealing frame. A manufacturing method of the SAW filter package structure is also disclosed.

9 Claims, 12 Drawing Sheets

(51) Int. Cl.
    *H03H 9/05*      (2006.01)
    *H03H 9/64*      (2006.01)
    *H01L 23/31*     (2006.01)
    *H01L 23/488*    (2006.01)
    *H03H 9/145*     (2006.01)
    *H03H 9/25*      (2006.01)

(52) U.S. Cl.
    CPC ........ *H03H 9/02992* (2013.01); *H03H 9/059* (2013.01); *H03H 9/14541* (2013.01); *H03H 9/25* (2013.01); *H03H 9/64* (2013.01)

(58) Field of Classification Search
    CPC ........... H01L 2224/16227; H01L 24/32; H01L 24/16; H01L 2224/276; H01L 2224/29011; H01L 2224/29017; H01L 2224/29027; H01L 2224/29191; H01L 2224/32013; H01L 2224/32105; H01L 2224/32227; H01L 2224/32235; H01L 2224/81005; H01L 2224/81439; H01L 2224/83005; H01L 2224/83192; H01L 24/73; H01L 24/92; H01L 24/97; H01L 2224/73203; H01L 2224/81447; H01L 2224/81455; H01L 2224/83439; H01L 2224/83447; H01L 2224/83455; H01L 2224/9211; H01L 23/315; H01L 2224/97; H01L 2924/181
    USPC .......................................... 333/133, 193–196
    See application file for complete search history.

SURFACE ACOUSTIC WAVE FILTER PACKAGE STRUCTURE AND METHOD OF MANUFACTURING THE SAME

CROSS REFERENCE TO RELATED APPLICATIONS

This Non-provisional application claims priority under 35 U.S.C. § 119(a) on Patent Application No. 107139798 filed in Republic of China on Nov. 9, 2018, the entire contents of which are hereby incorporated by reference.

BACKGROUND

1. Technical Field

This invention relates to a semiconductor package and its manufacturing method, in particular, to a surface acoustic wave filter package structure and manufacturing method thereof.

2. Description of Related Art

A surface acoustic wave filter is a common component used in a communication system, and its operation principle is that electrical signal is changed to mechanical wave in a piezoelectric material, and the delayed mechanical wave is changed to electrical signal by an output electrode since propagation of the mechanical wave in the piezoelectric material is delay. The delayed output signal is combined and regenerated to achieve filter unnecessary signal and noise and improve the signal quality.

The surface acoustic wave filter is characterized in high flexibility, analog/digital compatibility, good group delay time deviation and excellent frequency selectivity (selectable frequency range is 10 MHz-3 GHz), small input and output impedance error, small transmission loss, good anti-electromagnetic interference (EMI), good reliability, and making component with small volume, small weight which is about 1/40 and 1/30 weight of traditional ceramic dielectric filter, and achieving a plurality of complicated functions.

In all existing portable device, to reduce the volume of the surface acoustic wave filter, three improvement methods are used generally: the first is to optimize the performance of the components so as to achieve a reduced volume design with good effect; the second is to improve the package form of the components, change of traditional round metal shell package to flat metal package or LCCC surface mounting; and third, package surface acoustic wave filter with different functions together to a combined component to reduce PCB area.

FIG. 1 shows the sectional view of a surface acoustic wave filter package structure, which is made by the technology of wafer level chip scale packaging (WLCSP). As shown in FIG. 1, the conventional surface acoustic wave filter package structure includes an upper chip 15, a lower chip 11, wherein, a conductive circuit 12 and a surface acoustic wave filter circuit 13 are disposed on the lower chip 11. A plastic frame is arranged between the upper chip 15 and the lower chip 11 to form a space 101, the space is a vacuum resonant cavity, and the surface acoustic wave filter circuit 13 is located in the vacuum space 101. A bump 18 is electrically connected with the outside surface of the upper chip 15 by an under bump metallurgy (UBM) 17 and a plated metal film 16. The plated metal film 16 is extended from the outside surface of the upper chip 15 to clad the plastic frame 14, the conductive circuit 12, and even the connection between the lower chip 11 and the conductive circuit 12 so as to electrically connect the bump 18, the upper chip 15 and the lower chip 11.

However, for the electrical connection design of the conventional surface acoustic wave filter package structure, the upper chip 15 is first connected with the lower chip 11, and then the plated metal film 16 is formed on the exterior of the package structure by electroplating process, and so it is impossible to simplify manufacturing flow and it is possible to pollute or damage the chip by relevant process, causing difficulty in control of yield and cost. Therefore, it is one of the important subject matter to solve the problems mentioned above, to thin the product, ensure the filtering efficiency and reduce the manufacturing cost.

SUMMARY OF THE INVENTION

In view of the foregoing, the invention is to provide a surface acoustic wave filter package structure and manufacturing method thereof, so as to thin the package structure, ensure filtering efficiency and reduce the manufacturing cost by panel level packaging of the surface acoustic wave filter package structure.

In order to achieve the above purpose, a surface acoustic wave (SAW) filter package structure includes a dielectric substrate, a chip, a polymer sealing frame and a mold sealing layer. The dielectric substrate includes a dielectric layer, a first patterned conductive layer, a second patterned conductive layer and a conductive connection layer. The first patterned conductive layer is arranged in the dielectric layer on the first side of the dielectric substrate. The second patterned conductive layer is arranged in the dielectric layer on the second side of the dielectric substrate, and at least includes a conductive circuit portion, a conductive electrode portion and a finger electrode portion. The conductive connection layer is arranged in the dielectric layer and electrically connected with the first patterned conductive layer and the second patterned conductive layer. The chip includes an active surface. The active surface of the chip faces toward the second side of the dielectric substrate and corresponds to the finger electrode portion of the second patterned conductive layer. The polymer sealing frame is arranged between the chip and the dielectric substrate, and surrounded at the periphery of the chip to form a closed cavity with the chip and the dielectric substrate. The mold sealing layer is arranged on the dielectric substrate and covers the chip and the polymer sealing frame.

In one embodiment of the invention, the SAW filter package structure further includes a patterned protective layer, which is arranged on the first side of the dielectric substrate and partially exposed out of the first patterned conductive layer.

In one embodiment of the invention, there is a closed overlapped area between the polymer sealing frame and the chip in a projection direction.

In one embodiment of the invention, wherein the polymer sealing frame is fully clad by the mold sealing layer. In other embodiment, the side of the polymer sealing frame is exposed out of the mold sealing layer.

In one embodiment of the invention, at least one electrical connecting pad is arranged on the active surface of the chip, and the electrical connecting pad is electrically connected with the conductive electrode portion of the second patterned conductive layer by a conductive component.

In one embodiment of the invention, wherein the conductive component is a conductive bump, a solder ball or a conducting resin.

In one embodiment of the invention, wherein the conductive connection layer includes at least one conductive pillar or a conductive blind hole.

In one embodiment of the invention, wherein the mold sealing layer is made of a molding compound.

In one embodiment of the invention, wherein one surface of the first patterned conductive layer is exposed out of the surface of the dielectric layer of the dielectric substrate.

In one embodiment of the invention, wherein the surface of the second patterned conductive layer is the surface of the dielectric layer overhanging the second side of the dielectric substrate. In other embodiments, a dielectric layer is covered onto the surface of the second patterned conductive layer, and exposed out of one of the surfaces of the second patterned conductive layer.

Further, to achieve the above purpose, a manufacturing method for SAW filter package structure includes the following steps: Step 1 is to form the dielectric substrate with a first side and a second side on a carrier board, wherein the dielectric substrate includes a first patterned conductive layer, a dielectric layer, a conductive connection layer and a second patterned conductive layer; Step 2 is to from a plurality of polymer sealing frames on the second side of the dielectric substrate, wherein the polymer sealing frames have an opening to partially expose out of the second side of the dielectric substrate; Step 3 is to arrange a plurality of the chips onto corresponding polymer sealing frames, wherein, the active surface of the chip faces toward the second side of the dielectric substrate, and corresponds to the opening of the polymer sealing frame to form a closed cavity by corresponding polymer sealing frame and chip and the dielectric substrate; Step 4 is to form a mold sealing layer to cover the chip and the polymer sealing frame; and Step 5 is to remove the carrier board so as to obtain the SAW filter package structure.

In one embodiment of the invention, wherein the step of forming the dielectric substrate includes the following steps: first, arrange the first patterned conductive layer on one surface of the carrier board, second, arrange a dielectric layer on the carrier board to cover the first patterned conductive layer; third, form a plurality of openings on the dielectric layer to partially expose the first patterned conductive layer; finally, arrange the conductive connection layer on the openings, and the second patterned conductive layer on the dielectric layer and the conductive connection layer.

In one embodiment of the invention, wherein after arrangement of the second patterned conductive layer, the method further include arrangement of another dielectric layer on the second side of the dielectric substrate and exposure out of the one surface of the second patterned conductive layer.

In one embodiment of the invention, wherein after removal of the carrier board, the method further includes arrangement of a patterned protective layer on the first side of the dielectric substrate and partial exposure out of the first patterned conductive layer.

In one embodiment of the invention, wherein before or after the removal of the carrier board, the method further includes cutting according to the area of the chips and the polymer sealing frames to form a plurality of single package structure.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 1:
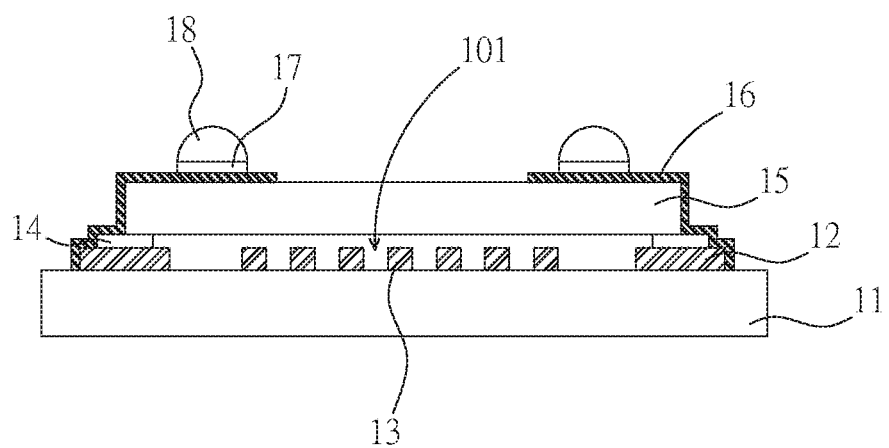
FIG. 1 is a schematic sectional view illustrating a conventional SAW filter package structure.
Figure 2:
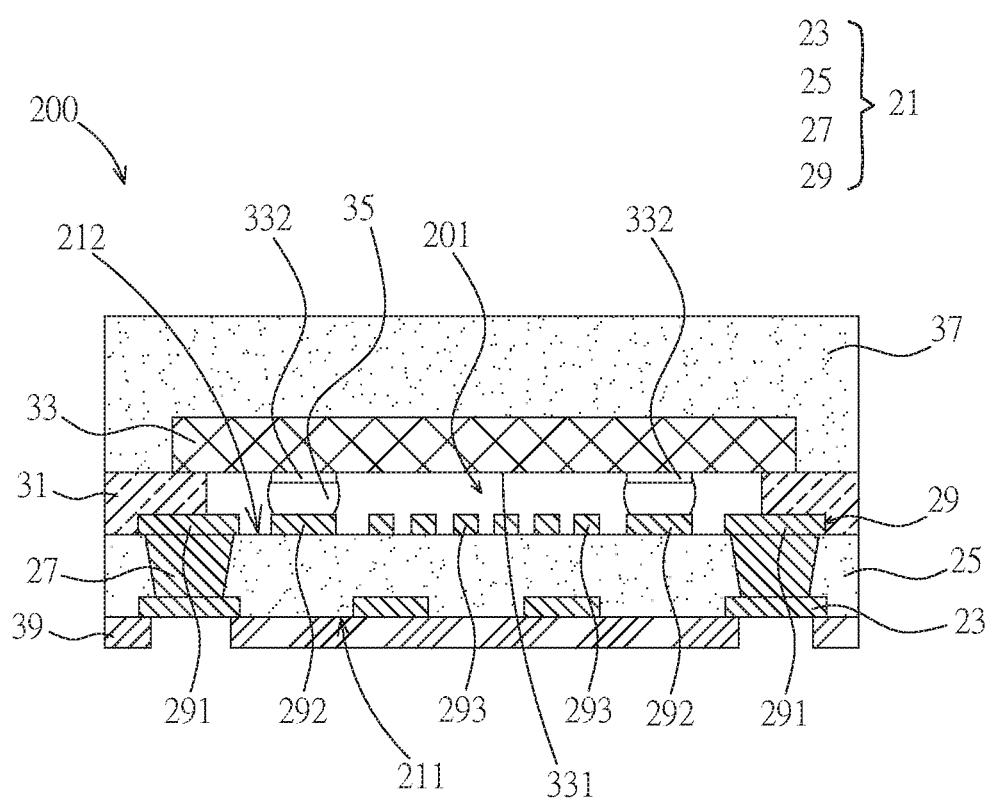
FIG. 2 is a schematic sectional view illustrating a SAW filter package structure according to the preferred embodiment of the present invention.

As shown in FIG. 2, the surface acoustic wave filter package structure 200 according to the embodiment of the invention includes a dielectric substrate 21, a chip 33, a polymer sealing frame 31, a mold sealing layer 37 and a patterned protective layer 39.

The dielectric substrate 21 includes a dielectric layer 25, a first patterned conductive layer 23, a second patterned conductive layer 29 and a conductive connection layer 27. Additionally, the dielectric substrate 21 includes a first side 211 and a second side 212, which are arranged oppositely.

The dielectric layer 25 may be made of a dielectric material with high filler content, for example molding compound, main substrate such as Novolac-Based Resin, Epoxy-Based Resin or Silicone-Based Resin, which is about 8 wt. %-12 wt. % of the molding compound, and a filler which is about 70 wt. %-90 wt. % of the molding compound, wherein the filler may includes silicon dioxide and aluminum oxide to improve the mechanical strength, reduce the linear coefficient of thermal expansion, improve heat conduction and water resistance and reduce glue overflow.

The first patterned conductive layer 23 is arranged in the dielectric layer 25 at the first side 211 of the dielectric substrate 21, and the first patterned conductive layer 23 is partially exposed at the surface of the dielectric layer 25. The first patterned conductive layer 23 further includes a conductive metal material, for example, copper, silver, nickel or their alloy.

The second patterned conductive layer 29 is arranged on the dielectric layer 25 at the second side 212 of the dielectric substrate 21, and at least zoned to a conductive circuit portion 291, a conductive electrode portion 292 and a finger electrode portion 293 according to its role and connection relationship. Same with the first patterned conductive layer 23, the second patterned conductive layer 29 may include a conductive metal material, for example, copper, silver, nickel or their alloy.

The conductive connection layer 27 is arranged in the dielectric layer 25, and electrically connected with the first patterned conductive layer 23 and the second patterned conductive layer 29. The conductive connection layer 27 may be a conductive pillar or a conductive blind hole. The conductive connection layer 27 may be made of same or different conductive metal material for the first patterned conductive layer 23 and the second patterned conductive layer 29, for example, copper.

The chip 33 includes an active surface 331, the active surface 331 of the chip 33 faces towards the second side 212 of the dielectric substrate 21 and is arranged in such a way that the active surface 331 corresponds to the finger electrode portion 293 of the second patterned conductive layer 29. In the embodiment, the chip 33 is a surface acoustic wave (SAW) chip. Additionally, a plurality of electrical connecting pads 332 are arranged on the active surface 331 of the chip 33, the chip 33 is electrically connected with the conductive electrode portion 292 of the second patterned conductive layer 29 through the electrical connecting pads 332 and a conductive component 35, wherein the conductive component 35 is a conductive bump, a solder ball or a conducting resin. If the conductive bump is used, the conductive bump may include a gold bump, an eutectic solder bump, or high lead solder bump.

The polymer sealing frame 31 is arranged between the chip 33 and the dielectric substrate 21, and surrounded at the periphery of the chip 33 to form a closed cavity 201 with the chip 33 and the dielectric substrate 21. The polymer sealing frame 31 is designed to maintain the sealed (airtight) status of the closed cavity 201, and its material may be a high polymer material with elasticity or compressibility. It is noted that the elasticity or compressibility refers to lower elastic coefficient rather than high elastic coefficient, and it may includes the materials using rubber or resin as substrate.

The mold sealing layer 37 is arranged on the dielectric substrate 21, and covers the chip 33 and the polymer sealing frame 31. Same with the dielectric layer 25, the mold sealing layer 37 may be made of the dielectric material with high filler content, for example, the molding compound.

The patterned protective layer 39 is arranged on the dielectric layer 25 at the first side 211 of the dielectric substrate 21, and covers the surface of the dielectric layer 25, and partially first patterned conductive layer 23, wherein the first patterned conductive layer 23 exposed out of the patterned protective layer 39 may be used as the electric connecting pad (or welding pad) electrically connected with an external component (for example, a circuit board).

As shown in FIGS. 3A-3J, the manufacturing method for the surface acoustic wave filter package structure 400 according to the embodiment of the invention includes Steps S01-S11.

Figure 3A:
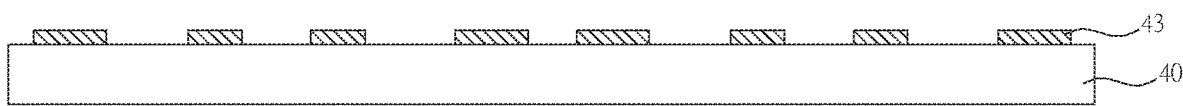
FIG. 3A through FIG. 3J are schematic diagrams illustrating a method of making a SAW filter package structure according to the preferred embodiment of the present invention.

As shown in FIG. 3A, Step S01 is to provide a carrier board 40, and to arrange a first patterned conductive layer 43 on the surface of the carrier board 40. The carrier board 40 may include a metal board or an insulating board. If the metal board is used for the carrier board 40, its material is copper. On the other hand, if the insulating board is used for the carrier board 40, its material may be the mixture of ceramic, epoxy resin, polyimide, cyanide ester, carbon fiber or glass fiber. The first patterned conductive layer 43 may include a conductive metal material, such as copper, silver, nickel or their alloy. The first patterned conductive layer 43 may coordinate with an additional photoresist layer (not shown in the figure) to perform exposure and development process and the first patterned conductive layer 43 is formed on the carrier board 40 by electroplating process.

Figure 3B:
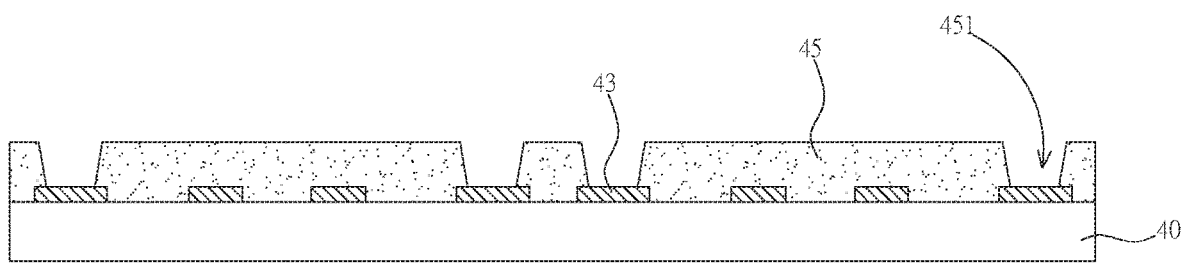

As shown in FIG. 3B, Step S02 is to arrange a dielectric layer 45 on the surface of the carrier board 40 to cover the first patterned conductive layer 43, and formation of a plurality of openings on the dielectric layer 45 by laser drilling technology to partially expose the first patterned conductive layer 43.

Figure 3C:
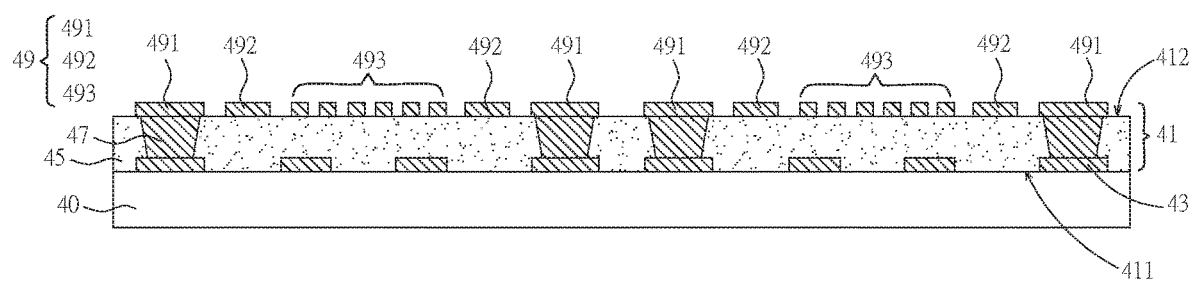

As shown in FIG. 3C, Step S03 is to arrange the conductive connection layer 47 in those openings shown in FIG. 3B, and to arrange a second patterned conductive layer 49 on the dielectric layer 45 and the conductive connection layer 47. Similar with the first patterned conductive layer 43, the conductive connection layer 47 and the second patterned conductive layer 49 may coordinate with an additional photoresist layer (not shown in the figure) to perform photolithography process including exposure and development process, and the conductive connection layer 47 is arranged in the opening 451 by the electroplating process, the second patterned conductive layer 49 is arranged on the dielectric layer 45 and the conductive connection layer 47. The second patterned conductive layer 49 may be zoned to a conductive circuit portion 491, a conductive electrode portion 492 and a finger electrode portion 493.

For the convenience for of hereinafter description, it is thereby stated that the first patterned conductive layer 43, the dielectric layer 45, the conductive connection layer 47 and the second patterned conductive layer 49 may be called as the dielectric substrate 41 including the first side 411 and the second side 412, which are arranged oppositely, wherein the side of the dielectric substrate 41 contacting the carrier board 40 is the first side 411. Additionally, the dielectric substrate 41 manufactured by the above-mentioned process is an ultrathin substrate with not more than 100 micron thickness.

Figure 3D:
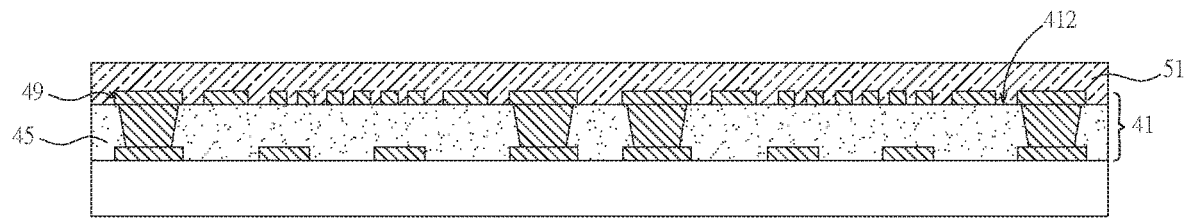

As shown in FIG. 3D, Step S04 is to arrange a polymer sealing layer 51 on the second side 412 of the dielectric substrate 41, in other words, the polymer sealing layer 51 is arranged onto the dielectric layer 45 and the second patterned conductive layer 49.

Figure 3E:
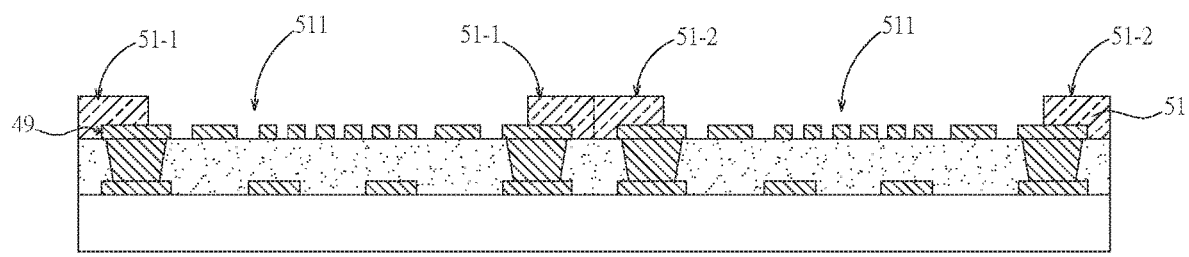

As shown in FIG. 3E, Step S05 is to form a plurality of openings 511 on the polymer sealing layer 51 to partially expose second patterned conductive layer 49 to form a plurality of the polymer sealing frames 51-1 and 51-2.

Figure 3F:
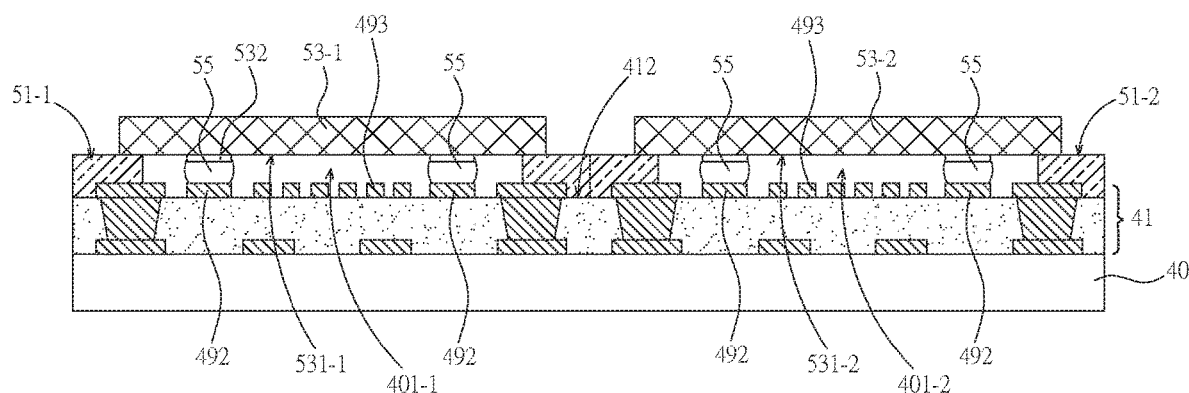

As shown in FIG. 3F, Step S06 is to arrange a plurality of the chips 53-1, 53-2 on corresponding polymer sealing frames 51-1 and 51-2, wherein, the active surfaces 531-1, 531-2 of the chips 53-1, 53-2 face towards the second side 412 of the dielectric substrate 41. In the embodiment, the electrical connecting pad 532 is arranged on the active surfaces 531-1, 531-2 of the he chips 53-1, 53-2, respectively corresponding to the conductive electrode portion 492 of the second patterned conductive layer 49, to achieve their electrical connection by the conductive component 55, wherein the conductive component 55 may be the conductive bump, the solder ball or the conducting resin, which is formed by printing process or dispensing process.

The polymer sealing frames 51-1, 51-2 and the chips 53-1, 53-2 form the closed cavities 401-1, 401-2 together with the dielectric substrate 41, and the finger electrode portion 493 of the second patterned conductive layer 49 is located in the closed cavities 401-1, 401-2.

It is to be noted, the chip arranged in single wafer can be simultaneously packaged by traditional wafer level process, with such disadvantages such as time-consuming, various process limitations. Comparing with the traditional wafer level package process, panel level packaging process is used for this invention; that is, the area of the carrier board 40 is plural times of the area of single wafer. All chips cut from a plurality of the wafers can be simultaneously packed by the carrier board 40 with large size according to this invention to effectively reduce the manufacturing process time.

Figure 3G:
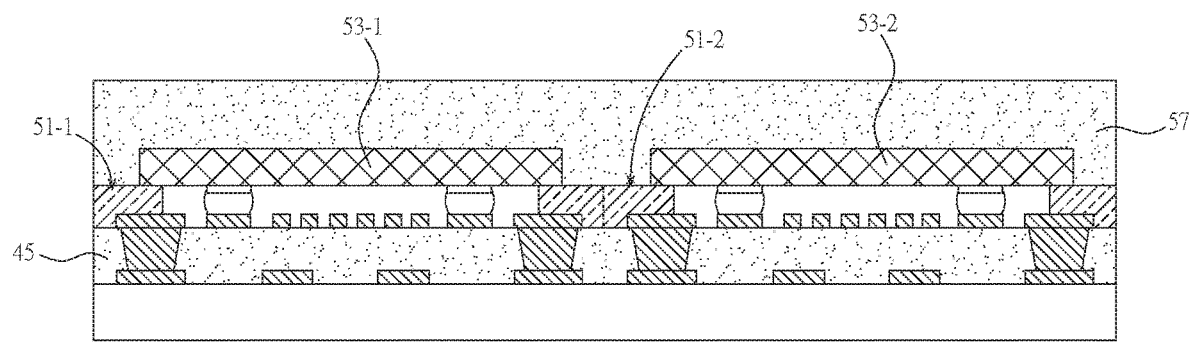

As shown in FIG. 3G, Step S07 is to arrange a mold sealing layer 57 by a molding process to cover the chips 53-1, 53-2 and the polymer sealing frames 51-1, 51-2. In the embodiment, the mold sealing layer 57 may be made of same with or different from the material of dielectric layer 45, including the dielectric material with high filler content, for example, the molding compound, main substrate such as phenolic resin, epoxy resin or silicone resin, which is about 8 wt. %-12 wt. % of the molding compound, and a filler which is about 70 wt. %-90 wt. % of the molding compound, wherein the filler may includes silicon dioxide and aluminum oxide to improve the mechanical strength, reduce the linear coefficient of thermal expansion, improve heat conduction and water resistance and reduce glue overflow.

Figure 3H:
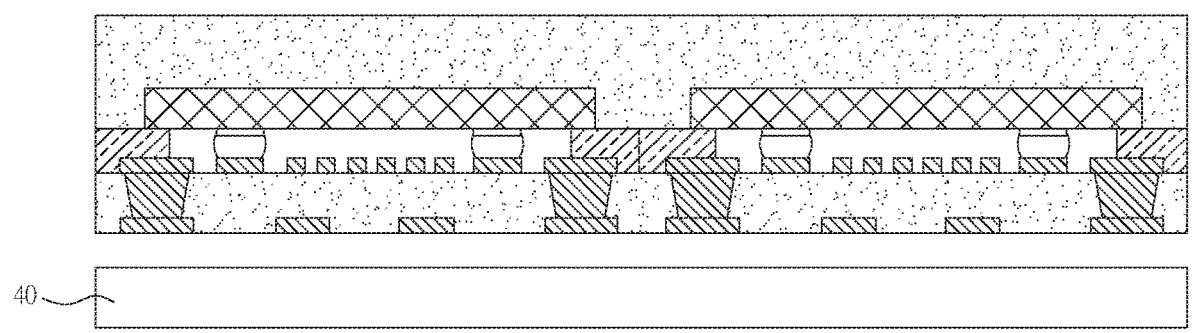

As shown in FIG. 3H, Step S08 is to remove the carrier board 40.

Figure 3I:
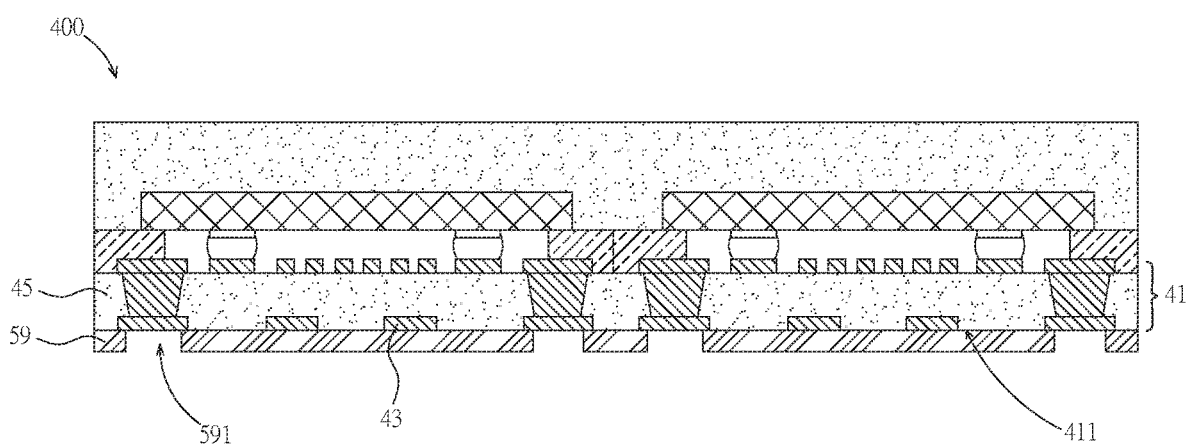

As shown in FIG. 3I, Step S09 is to arrange the patterned protective layer 59 on the first side 411 of the dielectric substrate 41 to complete the SAW filter package structure 400. In other words, the patterned protective layer 59 is arranged on the dielectric layer 45 and the first patterned conductive layer 43, wherein the opening 591 of the patterned protective layer 59 is formed by the laser drilling technology.

Figure 3J:
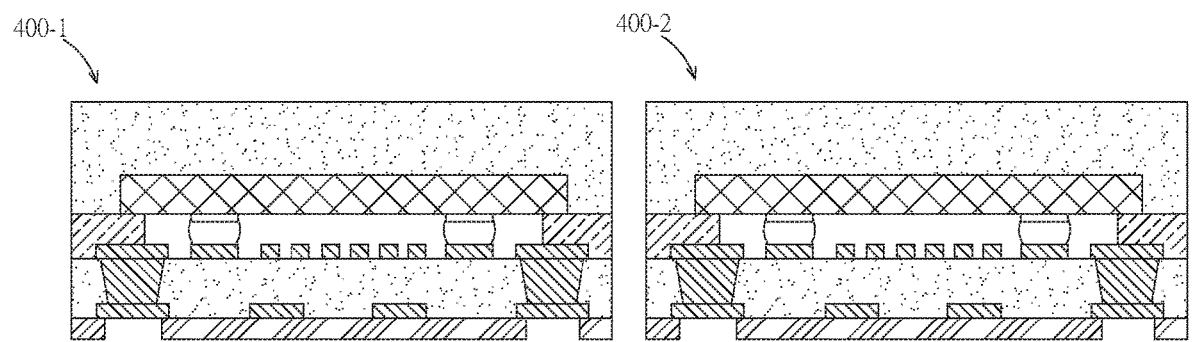

Finally, as shown in FIG. 3J, Step S10 is to cut the package structure 400 shown in FIG. 3I into independent SAW filter package structures 400-1, 400-2.

Figure 4:
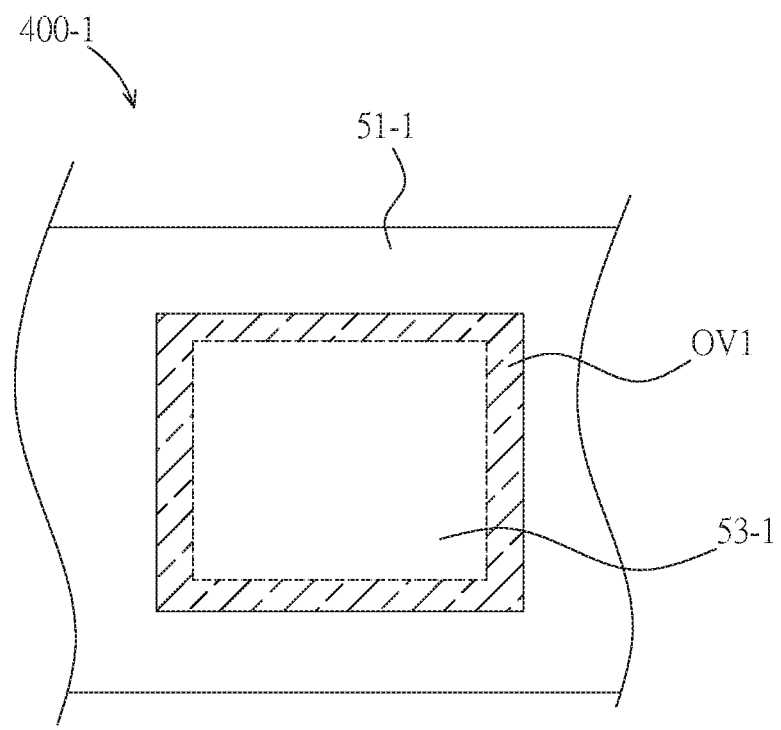
FIG. 4 is an over-look view illustrating the SAW filter package structure.

Continued to the above, as shown in FIG. 4 and described above, exampling the SAW filter package structure 400-1, the polymer sealing frame 51-1 and the chip 53-1 of the SAW filter package structure 400-1 has a closed overlapped area OV1 in the orthographic projection direction (e.g. overlook). The closed overlapped area OV1 is designed to prevent damaging the cavity structure by overflow of the raw material for the mold sealing layer 57 into the closed cavity 401-1 during arrangement of the mold sealing layer 57.

As shown in FIG. 2, in the aforementioned embodiment, the surface of the first patterned conductive layer 23 aligns with the surface of the dielectric layer 25 at the first side 211 of the dielectric substrate 21; the surface of the second patterned conductive layer 29 extrudes out of the surface of the dielectric layer 25 at the second side 212 of the dielectric substrate 21. In other embodiment, the surface of the first patterned conductive layer extrudes out of the surface of the dielectric layer at the first side of the dielectric substrate, and the surface of the second patterned conductive layer aligns with the surface of the dielectric layer at the second side of the dielectric substrate.

Figure 5:
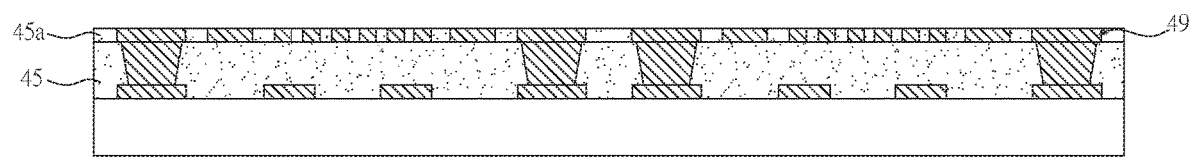
FIG. 5 is a schematic diagram illustrating a method of making a SAW filter package structure according to another preferred embodiment, wherein the alignment of the surface of the second patterned conductive layer with the surface of the dielectric layer at the second side of the dielectric substrate.
Figure 6:
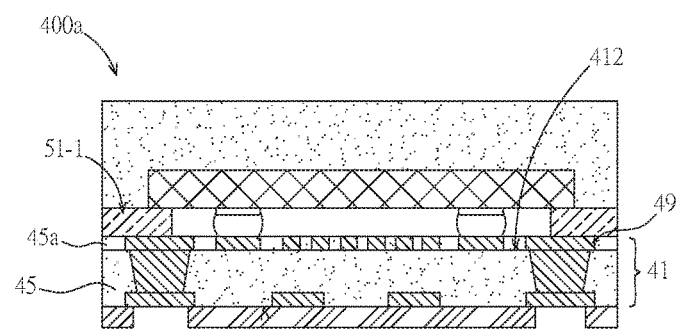
FIG. 6 is a schematic sectional view illustrating a SAW filter package structure according to another preferred embodiment of the present invention.

As shown in FIGS. 5 and 6, the implementation method is simply described for alignment of the surface of the second patterned conductive layer with the surface of the dielectric layer at the second side of the dielectric substrate.

As shown in FIG. 5, the step is performed after the Step S03 shown in FIG. 3C of the above-mentioned embodiment, and includes arrangement of another dielectric layer 45a on the dielectric layer 45 and the second patterned conductive layer 49 after arrangement of the second patterned conductive layer 49, and thinning the dielectric layer 45a by grinding process and exposing the surface of the second patterned conductive layer 49 to align with the surface with dielectric layer 45a. After completion of this step, Step S04 is performed, and subsequent steps are not repeated herein.

The SAW filter package structure manufactured hereby is shown in FIG. 6, the surface of the second patterned conductive layer 49 of the SAW filter package structure 400a aligns with the surface of the dielectric layer 45a at the second side 412 of the dielectric substrate 41. Further speaking, the surface of the second patterned conductive layer 49 is in same plane with the surface of the dielectric layer 45a and the polymer sealing frame 51-1.

Furthermore, in the above-mentioned embodiment, the side of the polymer sealing frame of the cut SAW filter package structure is exposed out of the mold sealing layer. In other embodiment, the side of the polymer sealing frame may be clad in the mold sealing layer to prevent fracturing and separating resulting from connection degradation.

Figure 7:
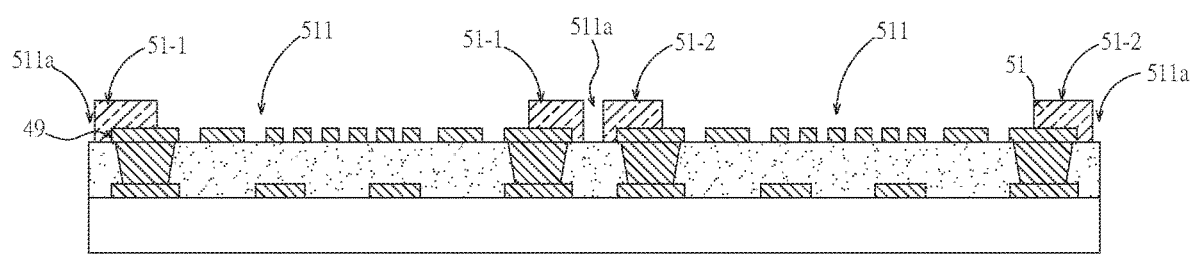
FIG. 7 is a schematic diagram illustrating a method of making a SAW filter package structure according to furthermore preferred embodiment, wherein the side of the polymer sealing frame is clad in the mold sealing layer.
Figure 8:
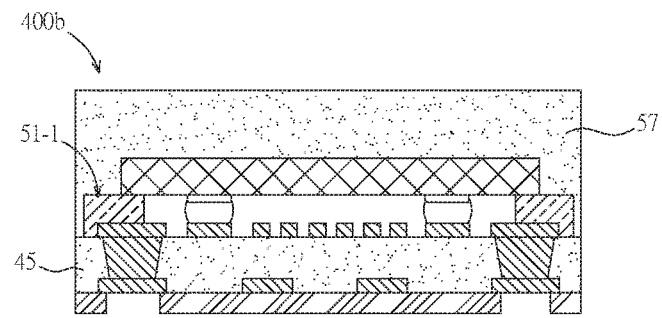
FIG. 8 is a schematic sectional view illustrating a SAW filter package structure according to furthermore preferred embodiment of the present invention.

As shown in FIGS. 7 and 8, a method is simply described for cladding the side of the polymer sealing frame in the mold sealing layer.

As shown in FIG. 7, the step is performed after the Step S04 shown in FIG. 3D of the above-mentioned embodiment, and includes formation of a plurality of opening 511 and 511a on the polymer sealing layer 51 by corrosion technology to partially expose the second patterned conductive layer 49. After completion of this step, Step S06-Step S10 are performed to manufacture the SAW filter package structure 400b as shown in FIG. 8, wherein the side of the polymer sealing frame 51-1 is clad in the mold sealing layer 57.

In conclusion, the SAW filter package structure according to this invention and manufacturing method thereof have the functional characteristics:

1. By panel level packaging, the chips for the plurality of the wafers are packaged in batch to improve production efficiency, and so, compared with the conventional WLCSP, this invention can achieve several times yield of the prior art and improve process efficiency and reduce cost significantly.

2. In this invention, a high polymer material is used as the polymer sealing frame to improve whole structure rigidity and sealing property together with cladding the mold sealing layer, and so, the SAW filter package structure according to this invention may be used in worse working environment with higher reliability and efficiency.

3. In this invention, after arrangement of the chip 33, the chip 33 is packaged by the mold sealing layer 37 to ensure that the chip 33 is not polluted or damaged in the subsequent process, so the yield can be improved.

4. The lower chip 11 of the traditional surface acoustic wave filter package structure is replaced with the thinned dielectric substrates 21, 41 to effectively thin the SAW filter package structure, which can fully meet elastic application environment requirements.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A surface acoustic wave filter package structure, comprising:
    a dielectric substrate, comprising:
    a dielectric layer, which has a first side and a second side, which is opposite to the first side;
    a first patterned conductive layer, which is arranged in the dielectric layer, and one surface of the first patterned conductive layer is exposed out of the first side of the dielectric layer;
    a second patterned conductive layer, which is arranged in the dielectric layer on the second side of the dielectric substrate, and at least has a conductive circuit portion, a conductive electrode portion and a finger electrode portion; and
    a conductive connection layer, which is arranged in the dielectric layer, and electrically connected to the first patterned conductive layer and the second patterned conductive layer;
    a chip having an active surface, which faces toward the second side of the dielectric substrate and corresponds to the finger electrode portion of the second patterned conductive layer;
    a polymer sealing frame, which is arranged between the chip and the dielectric substrate, and surrounded at a periphery of the chip to form a closed cavity with the chip and the dielectric substrate; and
    a mold sealing layer, which is arranged on the dielectric substrate and covers the chip and the polymer sealing frame, and the side of the polymer sealing frame is exposed out of the mold sealing layer.

2. The surface acoustic wave filter package structure of claim 1, further comprising:
    a patterned protective layer, which is arranged on the first side of the dielectric substrate and partially exposed out of the first patterned conductive layer.

3. The surface acoustic wave filter package structure of claim 1, wherein a closed overlapped area exists between the polymer sealing frame and the chip in a projection direction.

4. The surface acoustic wave filter package structure of claim 1, wherein the polymer sealing frame is fully clad by the mold sealing layer.

5. The surface acoustic wave filter package structure of claim 1, wherein the second patterned conductive layer is arranged in the dielectric layer, and a surface of the second patterned conductive layer is the surface of the dielectric layer overhanging the second side of the dielectric substrate.

6. The surface acoustic wave filter package structure of claim 1, wherein at least one electrical connecting pad is arranged on the active surface of the chip, and the at least one electrical connecting pad is electrically connected to the conductive electrode portion of the second patterned conductive layer by a conductive component.

7. The surface acoustic wave filter package structure of claim 6, wherein the conductive component is a conductive bump, a solder ball or a conducting resin.

8. The surface acoustic wave filter package structure of claim 1, wherein the conductive connection layer comprises at least one conductive pillar or a conductive blind hole.

9. The surface acoustic wave filter package structure of claim 1, wherein the mold sealing layer is made of a molding compound.

* * * * *